(12) United States Patent
Ned et al.

(10) Patent No.: US 10,825,719 B2
(45) Date of Patent: *Nov. 3, 2020

(54) METHODS OF FABRICATING SILICON-ON-INSULATOR (SOI) SEMICONDUCTOR DEVICES USING BLANKET FUSION BONDING

(71) Applicant: Kulite Semiconductor Products, Inc., Leonia, NJ (US)

(72) Inventors: Alexander A. Ned, Kinnelon, NJ (US); Sorin Stefanescu, New Milford, NJ (US); Joseph R. VanDeWeert, Maywood, NJ (US)

(73) Assignee: Kulite Semiconductor Products, Inc., Leonia, NJ (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/378,114

(22) Filed: Apr. 8, 2019

(65) Prior Publication Data
US 2019/0237358 A1   Aug. 1, 2019

Related U.S. Application Data

(63) Continuation of application No. 15/663,078, filed on Jul. 28, 2017, now Pat. No. 10,256,138, which is a continuation of application No. 13/834,329, filed on Mar. 15, 2013, now Pat. No. 9,721,832.

(51) Int. Cl.
| | | |
|---|---|---|
| *H01L 21/762* | (2006.01) | |
| *H01L 27/12* | (2006.01) | |
| *H01L 27/146* | (2006.01) | |
| *H01L 31/18* | (2006.01) | |
| *H01L 23/00* | (2006.01) | |

(52) U.S. Cl.
CPC .... *H01L 21/76256* (2013.01); *H01L 21/7624* (2013.01); *H01L 21/76251* (2013.01); *H01L 27/1203* (2013.01); *H01L 27/14687* (2013.01); *H01L 24/80* (2013.01); *H01L 31/1892* (2013.01); *H01L 2221/68363* (2013.01); *H01L 2224/80896* (2013.01)

(58) Field of Classification Search
CPC ........... H01L 27/1203; H01L 21/76256; H01L 27/14687; H01L 21/7624; H01L 21/76251; H01L 2221/68363; H01L 2224/80896; H01L 24/80; H01L 31/1892
See application file for complete search history.

(56) References Cited

U.S. PATENT DOCUMENTS

| | | | |
|---|---|---|---|
| 5,286,671 A | 2/1994 | Kurtz et al. | |
| 7,335,527 B2 * | 2/2008 | Sawyer | B81C 1/00182 |
| | | | 438/458 |
| 7,605,053 B2 | 10/2009 | Couillard et al. | |
| 7,615,814 B2 | 11/2009 | Noma et al. | |

(Continued)

*Primary Examiner* — Bac H Au
(74) *Attorney, Agent, or Firm* — Troutman Pepper Hamilton Sanders LLP; James E. Schutz; Christopher C. Close, Jr.

(57) ABSTRACT

A method for fabricating silicon-on-insulator (SOI) semiconductor devices, wherein the piezoresistive pattern is defined within a blanket doped layer after fusion bonding. This new method of fabricating SOI semiconductor devices is more suitable for simpler large scale fabrication as it provides the flexibility to select the device pattern/type at the latest stages of fabrication.

20 Claims, 6 Drawing Sheets

(56) References Cited

U.S. PATENT DOCUMENTS

| | | |
|---|---|---|
| 7,709,897 B2 | 5/2010 | Kurtz et al. |
| 7,989,894 B2 | 8/2011 | Kurtz et al. |
| 8,569,850 B2 | 10/2013 | Kok et al. |
| 8,658,508 B2 | 2/2014 | Shichi et al. |
| 8,673,703 B2 | 3/2014 | Lin et al. |
| 8,772,130 B2 | 7/2014 | Ohki |
| 9,721,832 B2 | 8/2017 | Ned et al. |
| 10,256,138 B2 * | 4/2019 | Ned ................ H01L 21/76256 |
| 2003/0085424 A1 | 5/2003 | Bryant et al. |
| 2008/0057732 A1 | 3/2008 | Yamazaki |
| 2009/0280621 A1 | 11/2009 | Endo et al. |
| 2011/0117691 A1 | 5/2011 | Broekaart et al. |
| 2012/0091543 A1 | 4/2012 | Torashima et al. |

* cited by examiner

METHODS OF FABRICATING SILICON-ON-INSULATOR (SOI) SEMICONDUCTOR DEVICES USING BLANKET FUSION BONDING

RELATED APPLICATIONS

This application is a continuation application claiming priority under 35 U.S.C. § 120 to U.S. patent application Ser. No. 15/663,078 entitled "Methods of Fabricating Silicon-On-Insulator (SOI) Semiconductor Devices Using Blanket Fusion Bonding," filed 28 Jul. 2017 and published as U.S. Patent Application Publication No. 20170330792 on 16 Nov 2017, which is a continuation application claiming priority under 35 U.S.C. § 120 to U.S. patent application Ser. No. 13/834,329, filed 15 Mar. 2013, now U.S. Pat. No. 9,721,832, which issued 1 Aug. 2017, the contents of which are incorporated by reference in their entirety as if fully set forth below.

TECHNICAL FIELD

The present invention relates generally to semiconductor manufacturing techniques and semiconductor devices, and more particularly to silicon-on-insulator (SOI) device manufacturing methods and devices.

BACKGROUND

Current methods for fabricating silicon-on-insulator (SOI) semiconductor devices involve a complex fusion bonding process that includes many fabrication steps prior to the actual fusion bonding. Some of these steps include masking, deposition, and etching. More specifically, current SOI fabrication methods require that a piezoresistive pattern be defined within the semiconductor substrate before fusion bonding. Patterning before fusion bonding, however, limits fabrication design as the final piezoresistive design must be selected during the early processes of fabrication, which results in less than ideal yields and increased wafer processing costs.

For illustrative examples, reference is made to U.S. Pat. No. 5,286,671, entitled "FUSION BONDING TECHNIQUE FOR USE IN FABRICATING SEMICONDUCTOR DEVICES", issued Feb. 15, 1994 and U.S. Pat. No. 7,439,159, entitled "FUSION BONDING PROCESS AND STRUCTURE FOR FABRICATING SILICON-ON-INSULATOR (SOI) SEMICONDUCTOR DEVICES", issued Oct. 21, 2008, to A. D. Kurtz et. al., both of which assigned to the assignee hereof, Kulite Semiconductor Products, Inc. The entire disclosures of which are hereby incorporated by reference as if being set forth in their entirety herein.

The present invention describes an improved fusion bonding process for fabricating SOI semiconductor devices, wherein the piezoresistive pattern may be defined after fusion bonding, which therefore provides more versatility in SOI fabrication and cheaper manufacturing costs.

BRIEF SUMMARY

Embodiments of the present invention provide a method for fabricating a silicon-on-insulator device, comprising doping a first surface of a first semiconductor wafer to produce a first doped layer, having a first doped side and a second doped side, and a semiconductor base layer; oxidizing the first side of the first doped layer; bonding the oxidized first doped layer to an oxidized second semiconductor wafer; removing the semiconductor base layer to expose the second doped side of the first doped layer; and patterning the second doped side of the first doped layer.

Other embodiments provide a method for fabricating a silicon-on-insulator device, comprising bonding a first semiconductor wafer, having a base layer, a first doped layer disposed on the base layer, and a first oxidized layer disposed on the first doped layer, to a second semiconductor wafer having a second oxidized layer disposed thereon, wherein the bond is between the first oxidized layer and the second oxidized layer; removing the base layer of the first semiconductor wafer to expose the first doped layer; and patterning the first doped layer.

DETAILED DESCRIPTION

Figure 1:
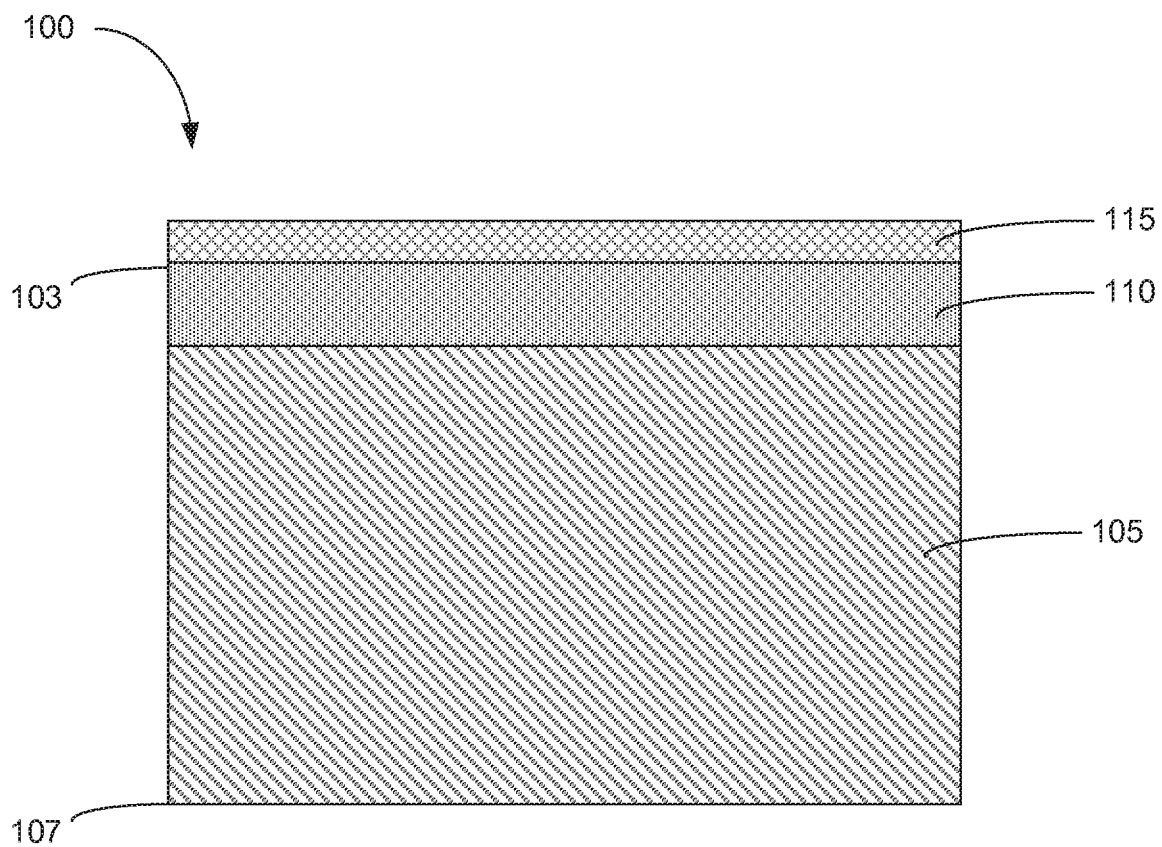
FIG. 1 illustrates an example of a silicon "pattern" wafer having a doped layer and an oxidized layer disposed thereon.

Although many embodiments of the invention are explained in detail, it is to be understood that other embodiments are contemplated. Accordingly, it is not intended that the invention is limited in its scope to the details of construction and arrangement of components set forth in the following description or illustrated in the drawings. The invention is capable of other embodiments and of being practiced or carried out in various ways. Also, in describing the preferred embodiments, specific terminology will be resorted to for the sake of clarity.

It must also be noted that, as used in the specification and the appended claims, the singular forms "a," "an," and "the" include plural referents unless the context clearly dictates otherwise.

Also, in describing the many embodiments, terminology will be resorted to for the sake of clarity. It is intended that each term contemplates its broadest meaning as understood by those skilled in the art and includes all technical equivalents which operate in a similar manner to accomplish a similar purpose.

By "comprising" or "containing" or "including" is meant that at least the named compound, element, particle, or method step is present in the composition or article or method, but does not exclude the presence of other compounds, materials, particles, method steps, even if the other such compounds, material, particles, method steps have the same function as what is named.

It is also to be understood that the mention of one or more method steps does not preclude the presence of additional method steps or intervening method steps between those steps expressly identified. Similarly, it is also to be understood that the mention of one or more components in a device or system does not preclude the presence of additional components or intervening components between those components expressly identified.

Referring now to the drawings, in which like numerals represent like elements, exemplary embodiments of the present invention are herein described. It is to be understood that the figures and descriptions of the present invention have been simplified to illustrate elements that are relevant for a clear understanding of the present invention, while eliminating, for purposes of clarity, many other elements found in typical pressure sensor assemblies and chip-package assemblies and methods of making and using the same. Those of ordinary skill in the art will recognize that other elements are desirable and/or required in order to implement the present invention. However, because such elements are well known in the art, and because they do not facilitate a better understanding of the present invention, a discussion of such elements is not provided herein.

Embodiments of the present invention provide methods for fabricating silicon-on-insulator (SOI) semiconductor devices, wherein the piezoresistive pattern is defined within a blanket doped layer after fusion bonding. This new method of fabricating SOI semiconductor devices is more suitable for simpler, large scale fabrication as it provides the flexibility to select the device pattern/type at later stages of fabrication, therefore distinguishing this method over prior art methods.

In the methods described herein, two separate semiconductors wafers are first prepared independently. Referring to FIG. 1, there is shown a first semiconductor wafer 100, which may also be referred to as the "pattern wafer" 100. The first semiconductor wafer 100 comprises a first surface 103, and a second surface 107. The pattern wafer 100 may be made of many materials, for example but not limited to, silicon. The pattern wafer 100 may be composed of N-type silicon, and in example embodiments, may have a single-crystalline structure. It shall be understood that the pattern wafer 100 may be of many geometries, and more specifically, may have, for example, a circular, square, or rectangular cross-section, or may take the form of a commercially available silicon wafer. Further, the pattern wafer 100 may undergo pre-processing steps, for example but not limited to, cleaning, etching, polishing, and/or lapping to provide a smooth surface finish before additional processing.

A first layer of oxide 115 may be grown on the pattern wafer 100. In an example embodiment, the first oxide layer 115 may be about 200 angstroms thick or thinner. One skilled in the art will appreciate that the growth of oxide layers on silicon substrates is well known in the art. For example, the first oxide layer 115 may be grown using thermal oxidation of the first surface 103 of the pattern wafer 100. By way of further example, such a thermal oxidation process may include heating the pattern wafer 100 to a temperature between about 1000° C. and 1300° C., and passing oxygen over the first surface 103 of the pattern wafer 100.

The pattern wafer may be blanket doped through the first oxide layer 115 to create a uniform doped layer 110 under the first surface 103 and a base layer 105 in the rest of the pattern wafer. In an example method, the pattern wafer is P++ boron doped, however other doping materials may also be used.

By utilizing the first oxide layer 115, "degenerate" doping can be achieved under surface 103, while preserving the requisite smoothness of the pattern wafer surface, analogously to the aforeincorporated '671 and '159 patents.

Doping could be done by thermal diffusion, ion implantation, or other semiconductor doping method.

Figure 2:
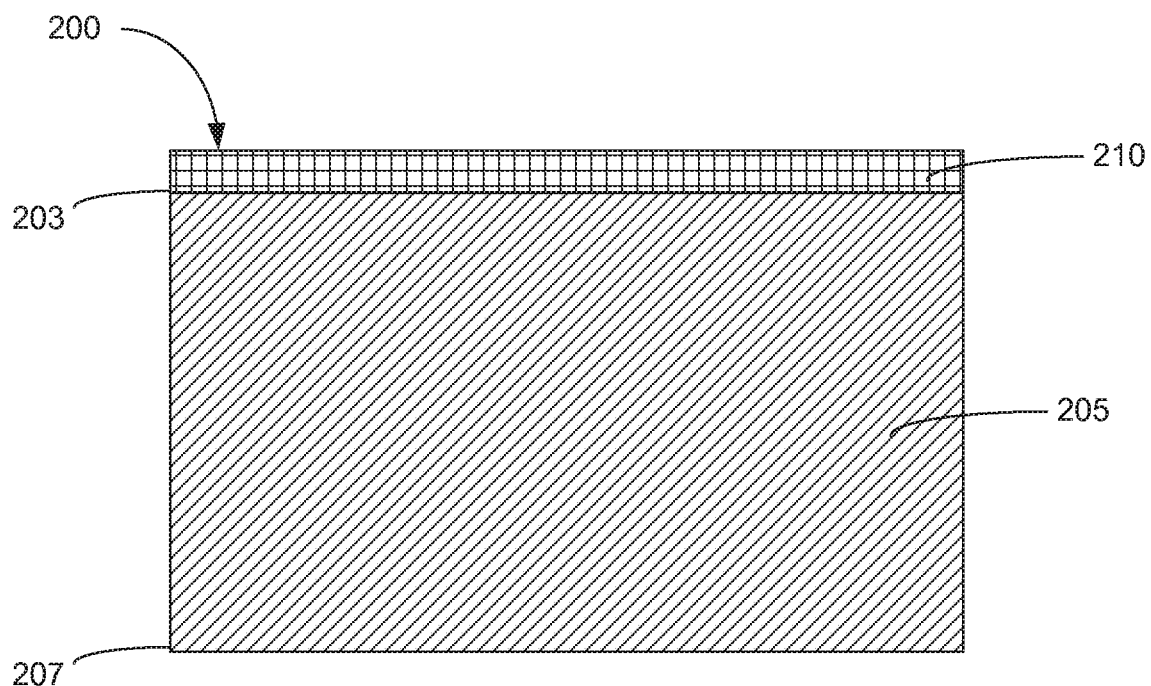
FIG. 2 illustrates an example silicon "substrate" wafer having an oxidized top surface.

Referring to FIG. 2, there is shown a second semiconductor wafer 200, which may also be referred to as the "substrate wafer" 200. The substrate wafer comprises a body 205, a first surface 203, and a second surface 207. It shall be understood that the thickness of the substrate wafer 200 may vary and is selected based on the pressure range of the targeted pressure sensor and/or on the deemed mechanical robustness of the final device. The substrate wafer 200 may be made of many materials, for example but not limited to silicon. The substrate wafer 200 may be composed of N-type silicon, and in example embodiments, may have a single-crystalline structure. It shall be understood that the substrate wafer 200 may be of many geometries, and more specifically, may have, for example a circular, square, or rectangular cross-section, or may take the form of a commercially available silicon wafer. Further, the substrate wafer 200 may undergo pre-processing steps, for example but not limited to, cleaning, etching, polishing, and/or lapping to provide a smooth surface finish before additional processing.

A second oxide layer 210 may be grown over the first surface 203 of the substrate wafer 200. In an example embodiment, the second oxide layer 210 is thicker than the first oxide layer 115 (depending on the required dielectric capability of the end device and manufacturing process requirements), however in other embodiments, the second oxide layer 210 may be of the same thickness or thinner than the first oxide layer 115. As previously described, one skilled in the art will appreciate that the growth of oxide layers on silicon substrates is well known in the art.

Figure 3:
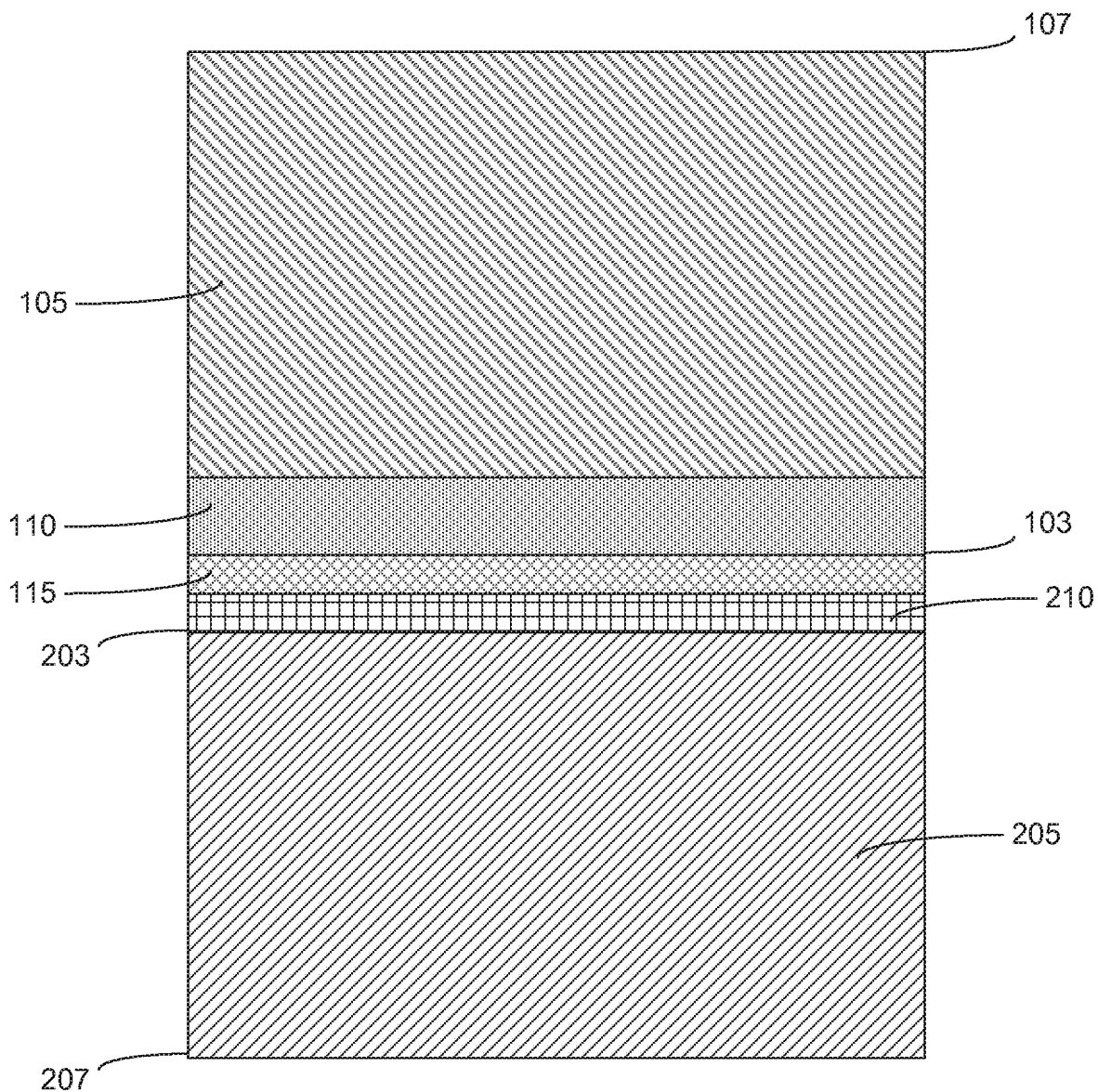
FIG. 3 illustrates the pattern wafer of FIG. 1 bonded to the substrate wafer of FIG. 2.

The pattern wafer 100 and the substrate wafer 200 are subsequently bonded together, as illustrated in FIG. 3. Prior to bonding the two wafers together, the pattern wafer 100 may undergo an additional P++ boron doping and/or oxidation process. In some examples, this doping and/or oxidation may take about five minutes or less. This additional boron-doped skin, $B_2O_3$, may act as an adhesion promoter during the subsequent fusion bonding process between the pattern wafer 100 and the substrate wafer 200. During the fusion bonding process, the pattern wafer 100 is aligned with the substrate wafer 200 having the first oxide layer 115 of the pattern wafer 100 facing the second oxide layer 210 of the substrate wafer 200. The first oxide layer 115 is fusion bonded to the second oxide layer 210, thereby bonding the pattern wafer 100 to the substrate wafer 200. In example methods, the fusion bonding temperature occurs at temperatures between about 800° C. and 1200° C. In other example methods, the fusion bonding temperature occurs at temperatures around 1000° C. for about five to thirty minutes. It shall be understood that the fusion bonding process described herein is not limited to these processing parameters, and may occur at different processing parameters.

Figure 4:
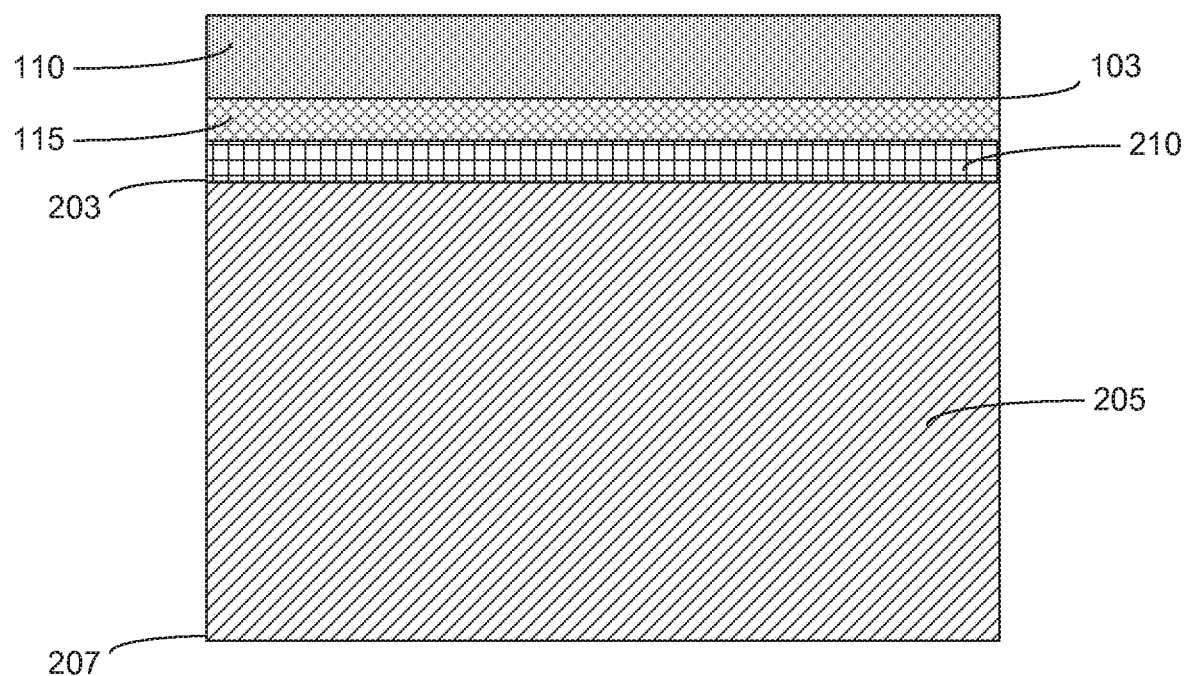
FIG. 4 illustrates an example silicon-on-insulator (SOI) semiconductor device in accordance with the present invention.

After the pattern wafer 100 is fusion bonded to the substrate wafer 200, the base layer 105 of the pattern wafer 100 may be removed. The base layer 105 of the pattern wafer 100 is removed such that the doped layer 110 and the first oxide layer 115 remain bonded to the substrate wafer 200, as illustrated in FIG. 4. There are many techniques that may be used to remove the base layer 105 of the pattern wafer 100. For example, a conductivity selective etchant, such as potassium hydroxide, may be used in accordance with conventional methodology.

Figure 5:
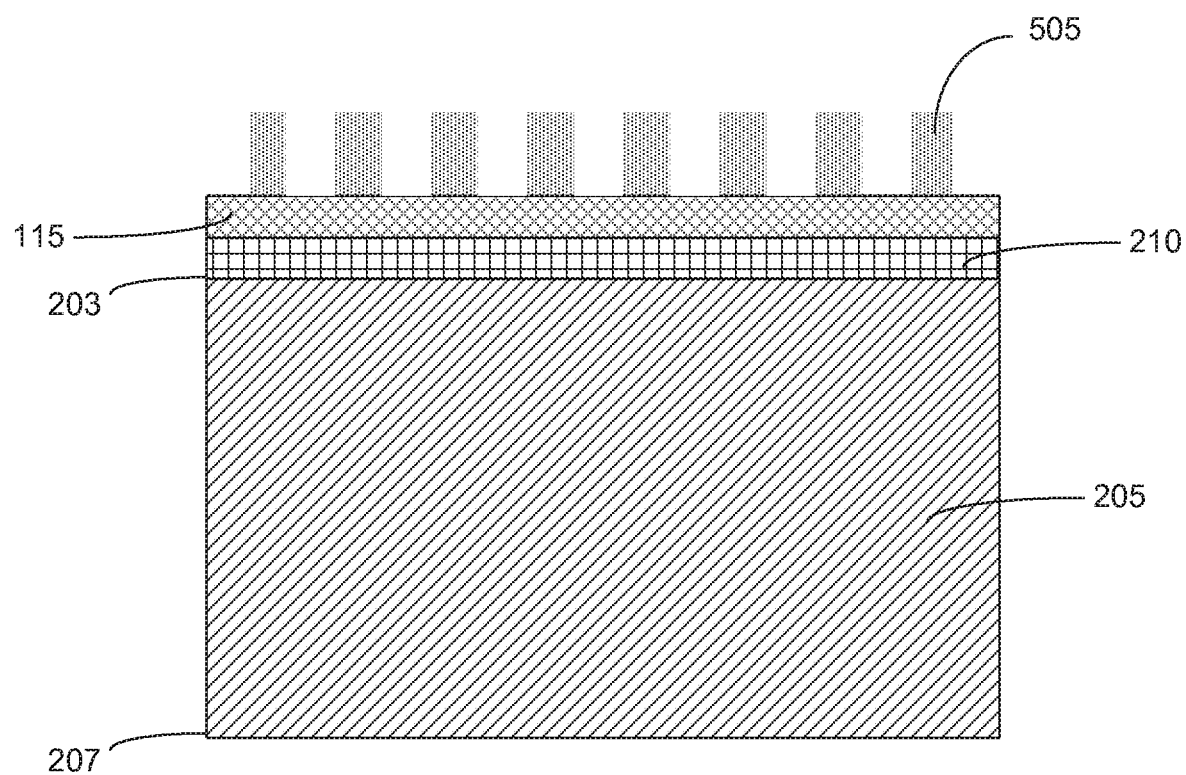
FIG. 5 illustrates the SOI of FIG. 4 having a piezoresistive pattern etched into a doped layer in accordance with the present invention.

Once the base layer 105 of the pattern wafer 100 is removed, a piezoresistive pattern 505 may be defined within the doped layer 110, as illustrated in FIG. 5. By way of further example, a layer of positive or negative exposure photoresist may be deposited over the doped layer 110. This photoresist may be selectively exposed, for example, ultraviolet (UV) radiation exposed, to define a masking pattern. The masking pattern may then be used to selectively etch away portions of the doped layer 110 thereby creating raised and recessed portions that define a piezoresistive pattern. Conventional etching techniques may be used to define the pattern, for example but not limited to, RIE-reactive ion etching, wet etching, ion milling, or other patterning techniques. It shall be understood that the specific piezoresistive pattern may vary depending on the type of SOI device being used and further, a diaphragm member may also be defined within the substrate wafer 200.

SOI devices may employ one or more piezoresistive elements that are mounted or diffused into a bridge pattern of resistors on a thin diaphragm member. The diaphragm member flexes upon application of force thereto and thereby causes stresses on the top surface. These stresses elongate or shorten the piezoresistors, therefore causing them to vary their resistance according to the deflection of the diaphragm. Reference is made to U.S. Pat. No. 4,498,229 entitled "PIEZORESISTIVE TRANSDUCER", issued on Feb. 12, 1985 to Leslie B. Wilner and to U.S. Pat. No. 4,672,354 entitled "FABRICATION OF DIELECTRICALLY ISOLATED FINE LINE SEMICONDUCTOR TRANSDUCERS AND APPARATUS", issued on Jun. 9, 1987 to Anthony D. Kurtz et al., assigned to the assignee herein, as illustrative examples of piezoresistive transducer constructions. It shall be understood, however, that many piezoresistive pattern configurations may be defined within the doped layer 110, and that applicability of the present invention is not limited to pressure transducer electronic configurations.

Figure 6:
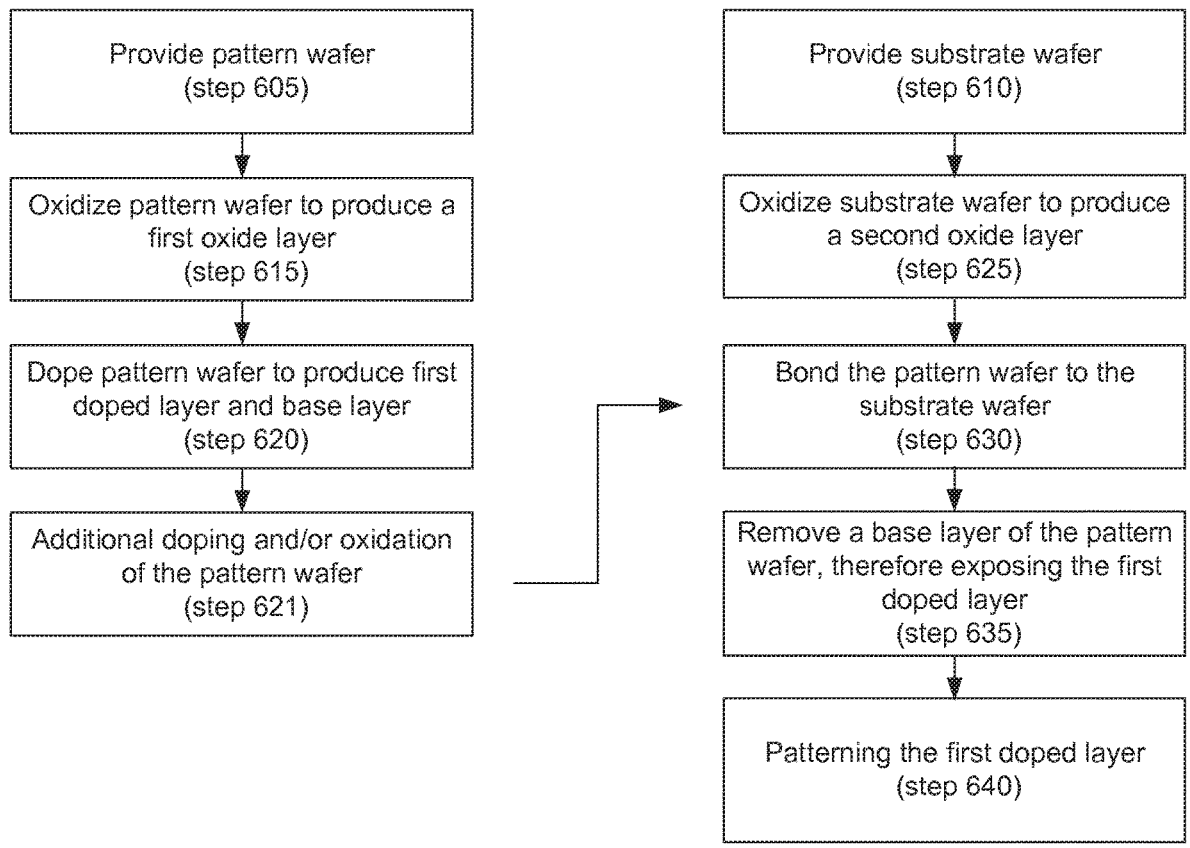
FIG. 6 illustrates a method flow diagram further detailing example methods of SOI fabrication.

Referring to FIG. 6, there is shown a method flow diagram further detailing an example method of SOI fabrication according to the present invention. First, the pattern wafer and the substrate wafer are prepared independently (steps 605/610). The pattern wafer is oxidized (step 615) to produce a first oxide layer. The pattern wafer is then doped (step 620) to produce a first doped layer. The pattern wafer may be further doped and/or oxidized (step 621). Meanwhile, a surface of the substrate wafer may also be oxidized to produce a second oxide layer 625. The pattern wafer and the substrate wafer are then fusion bonded together such that the oxidized first doped layer of the pattern wafer bonds to the oxidized second semiconductor wafer 630. A base layer of the pattern wafer is then removed using an etching technique to expose the first doped layer 635 and the doped layer is subsequently patterned into a desired piezoresistive pattern 640.

An unanticipated advantage of the various methods described herein is that the substrate and pattern wafers may be prepared prior to patterning, which enables improved process flexibility and efficiency. Specifically, this various methods of fabricating SOI semiconductor devices described herein are more suitable for simpler, large scale fabrication as they provide the flexibility to select the device pattern and type at later stages of fabrication.

It will be apparent to those skilled in the art that modifications and variations may be made in the apparatus and process of the present invention without departing from the spirit or scope of the invention. It is intended that the present invention cover the modification and variations of this invention provided they come within the scope of the appended claims and their equivalents.

What is claimed is:

1. A method for fabricating a silicon-on-insulator device, the method comprising:

oxidizing a surface of a first semiconductor wafer to produce an oxidized layer having an oxidized surface, the first semiconductor wafer having a base layer;

degenerately doping the first semiconductor wafer through the oxidized layer to produce a doped region;

bonding an oxidized second semiconductor wafer to the oxidized surface of the first semiconductor wafer;

after bonding the oxidized second semiconductor wafer to the oxidized surface of the first semiconductor wafer, removing the base layer from the first semiconductor wafer to expose a portion of the doped region;

patterning the exposed portion of the doped region to define a piezoresistive pattern on the exposed portion; and defining a diaphragm member in the oxidized second semiconductor wafer.

2. The method of claim 1, wherein the oxidized surface of the first semiconductor wafer is fusion bonded to the oxidized second semiconductor wafer.

3. The method of claim 1, wherein a thermal oxidation process heats the first semiconductor wafer between 1000° C. to 1300° C. to promote oxidation of the first semiconductor wafer.

4. The method of claim 1, wherein the doped region is P++ boron doped.

5. The method of claim 1, wherein the bonding occurs between 800° C. and 1200° C.

6. The method of claim 1, wherein the oxidized layer is 200 ångstöms or less in thickness.

7. The method of claim 1, wherein the doped region is patterned using wet etching techniques.

8. The method of claim 1, wherein the doped region is patterned using RIE-reactive ion etching techniques.

9. The method of claim 1, wherein the doped region is degenerately doped though diffusion.

10. The method of claim 1, wherein the oxidized second semiconductor wafer's thickness is determined based on a desired level of mechanical robustness.

11. The method of claim 1, wherein the bonding of the oxidized surface and the oxidized second semiconductor wafer occurs without annealing the oxidized layer.

12. The method of claim 1, wherein more than one piezoresistive patterns are patterned into the doped region.

13. A method for fabricating a silicon-on-insulator device, the method comprising:

oxidizing a surface of a first semiconductor wafer to produce an oxidized region having an oxidized surface, the first semiconductor wafer having a base layer;

degenerately doping the first semiconductor wafer through the oxidized region to produce a doped layer;

doping the oxidized surface to provide a doped film;

bonding an oxidized second semiconductor wafer to the doped film, the second oxidized semiconductor wafer having a diaphragm member defined therein;

after bonding an oxidized second semiconductor wafer to the doped film, removing the base layer from the first semiconductor wafer to expose a portion of the doped layer;

patterning the exposed portion of the doped layer to define a piezoresistive configuration on the exposed portion.

14. The method of claim 13, wherein the second semiconductor wafer's thickness is determined based on a desired level of mechanical robustness.

15. The method of claim 13, wherein the degenerate doping preserves a prerequisite smoothness of the first semiconductor wafer.

16. The method of claim 13, wherein one or more silicon-on-insulator devices are mounted on the diaphragm member.

17. A method for fabricating a silicon-on-insulator device, the method comprising:

bonding a first semiconductor wafer, having a base layer, a degenerately doped layer disposed on the base layer, and a first oxidized layer disposed on the degenerately doped layer, to a second semiconductor wafer having a second oxidized layer disposed thereon, wherein the degenerately doped layer is doped to a generally uniform depth through the first oxidized layer, and further wherein the bond is between the first oxidized layer and the second oxidized layer;

after bonding a first semiconductor wafer to a second semiconductor wafer, removing, without the using a buried oxide etch stop, the base layer of the first semiconductor wafer to expose the doped layer;

patterning the doped layer to define a piezoresistive pattern on the doped layer; and defining a diaphragm member in the second semiconductor wafer.

18. The method of claim 17, wherein more than one piezoresistive patterns are etched into the doped layer.

19. The method of claim 17, wherein the first oxidized layer undergoes additional P++ boron doping to produce a doped skin.

20. The method of claim 17, wherein the bonding of the first oxidized layer and the second oxidized layer occurs without annealing the first oxidized layer.

* * * * *